United States Patent
Huang et al.

(10) Patent No.: US 9,814,130 B2
(45) Date of Patent: Nov. 7, 2017

(54) REFLECTED SIGNAL ABSORPTION IN INTERCONNECT

(71) Applicant: Intel Corporation, Santa Clara, CA (US)

(72) Inventors: Shaowu Huang, Steilacoom, WA (US); John J. Abbott, Dupont, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/138,880

(22) Filed: Apr. 26, 2016

(65) Prior Publication Data

US 2016/0242273 A1  Aug. 18, 2016

Related U.S. Application Data

(62) Division of application No. 14/303,396, filed on Jun. 12, 2014, now Pat. No. 9,351,394.

(51) Int. Cl.
| | |
|---|---|
| *H05K 1/11* | (2006.01) |
| *H05K 1/02* | (2006.01) |
| *H05K 3/40* | (2006.01) |
| *H05K 3/46* | (2006.01) |
| *H01R 12/71* | (2011.01) |
| *H01R 13/6598* | (2011.01) |

(52) U.S. Cl.
CPC .......... *H05K 1/024* (2013.01); *H05K 1/0234* (2013.01); *H05K 1/115* (2013.01); *H05K 3/4038* (2013.01);
(Continued)

(58) Field of Classification Search
CPC ... H05K 1/00; H05K 1/02; H05K 1/11; H05K 1/116; H05K 1/233; H01R 12/00
(Continued)

(56) References Cited

U.S. PATENT DOCUMENTS 5,179,381 A * 1/1993 Hatakeyama .......... H01Q 17/00
                                                          342/1
7,204,701 B1 * 4/2007 Balasingham ....... H05K 1/0233
                                                          361/704

(Continued)

OTHER PUBLICATIONS

Non-Final Office Action dated Nov. 25, 2015 for U.S. Appl. No. 14/303,396, 11 pages.
(Continued)

*Primary Examiner* — Xiaoliang Chen
(74) *Attorney, Agent, or Firm* — Schwabe, Williamson & Wyatt, P.C.

(57) ABSTRACT

Embodiments of the present disclosure are directed toward techniques and configurations for electrical signal absorption in an interconnect stub. In one instance, a printed circuit board (PCB) assembly may comprise a substrate and an interconnect (such as a via) formed in the substrate to route an electrical signal within the PCB. The interconnect may include a stub formed on the interconnect. At least a portion of the stub may be covered with an absorbing material to at least partially absorb a portion of the electric signal that is reflected by the stub. The absorbing material may be selected such that its dielectric loss tangent is greater than one, for a frequency range of a frequency of the reflected portion of the electric signal. A dielectric constant of the absorbing material may be inversely proportionate to the frequency of the reflected electric signal. Other embodiments may be described and/or claimed.

14 Claims, 8 Drawing Sheets

(52) U.S. Cl.
CPC ........... *H05K 3/4647* (2013.01); *H01R 12/71* (2013.01); *H01R 13/6598* (2013.01); *H05K 1/116* (2013.01); *H05K 2201/10621* (2013.01); *Y10T 29/49156* (2015.01); *Y10T 29/49167* (2015.01)

(58) Field of Classification Search
USPC .............. 174/262; 361/704; 439/73; 333/33; 342/1
See application file for complete search history.

(56) References Cited

U.S. PATENT DOCUMENTS

| | | | |
|---|---|---|---|
| 2003/0074638 A1* | 4/2003 | Osaka | G06F 17/5036 716/102 |
| 2005/0030119 A1* | 2/2005 | Rawnick | H01P 1/184 333/33 |
| 2008/0121421 A1* | 5/2008 | Kashiwakura | H05K 1/0251 174/262 |
| 2014/0145891 A1* | 5/2014 | Palevsky | H01Q 9/0435 343/746 |
| 2015/0123678 A1* | 5/2015 | Neikirk | G01N 27/04 324/636 |

OTHER PUBLICATIONS

Notice of Allowance dated Feb. 28, 2016 for U.S. Appl. No. 14/303,396, 9 pages.

* cited by examiner

US 9,814,130 B2

REFLECTED SIGNAL ABSORPTION IN INTERCONNECT

This application is a divisional application of U.S. patent application Ser. No. 14/303,396, entitled "REFLECTED SIGNAL ABSORPTION IN INTERCONNECT", filed Jun. 12, 2014, and claims priority to the Ser. No. 14/303,396 application. The Specification of Ser. No. 14/303,396 is hereby fully incorporated by reference.

FIELD

Embodiments of the present disclosure generally relate to the field of printed circuit board design, and more particularly, to techniques and configurations for reducing reflected noise signals in interconnects used in the printed circuit boards.

BACKGROUND

Electric signals within multilayered printed circuit boards (PCB), silicon dies, or package substrates are routed through interconnects, such as vias, connectors, transmission lines, and the like. Some interconnects may have stubs formed on the interconnects due to design requirements or manufacturing limitations. For example, a via may provide a vertical electrical connection between two layers of the PCBs. A portion of the via that is not used for signal routing may form a stub. When transitioning through the interconnect, an electric signal may be split into two portions: one portion (desired transmission signals) may travel through the interconnect toward the receiving point (e.g., via the conductive line coupled with the interconnect), and the other portion may travel into the stub, creating reflected noise signals. The reflected noise signals may distort desired signals passing through the connector and decrease the usable bandwidth of the interconnect. Existing techniques aimed at reducing reflected noise signals, such as back-drilling, reducing signal routing length, or lowering the speed of signal transmission, may be costly and often ineffective, for at least certain types of interconnects.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
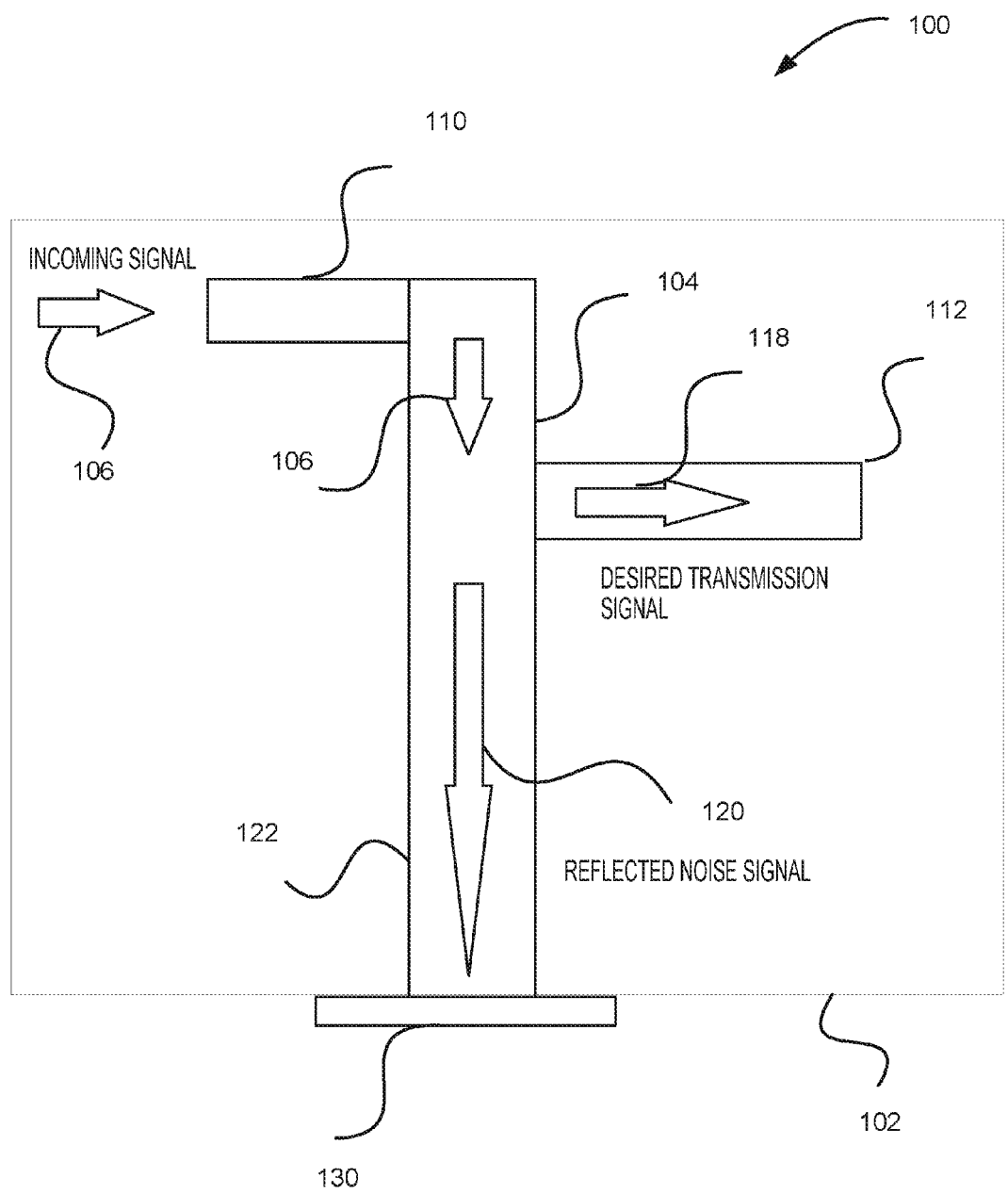
FIG. 1 illustrates a cross-section side view of an example printed circuit board (PCB) assembly 100, in accordance with some embodiments.

Embodiments of the present disclosure describe techniques and configurations for electrical signal reflection/absorption that may include interconnects such as vias having stubs at least partially covered with an absorption material to at least partially absorb a reflected portion of a signal traveling through the interconnect. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first layer formed, deposited, or otherwise disposed on a second layer" may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

The described techniques provide for at least partial absorption of the reflected portions of the electric signals routed through an interconnect. The reflected signals may be absorbed, at least partially, by an absorption material applied to at least a portion of the stub, for example, a bottom portion of the stub. To provide the desired absorption level, the absorption material may be selected to satisfy certain conditions. For example, a desired absorption may be achieved when the absorption material has a dielectric loss tangent that is greater than one for a frequency range of a frequency of the reflected signal and a dielectric constant that is inversely proportional to the frequency of the reflected signal. Types of interconnects with stubs that may be covered with absorption material may include vias, transmission lines, edge (e.g., gold finger) connectors, and the like.

The embodiments of the present disclosure will be described in reference to FIGS. 1-3. The embodiments may include an apparatus comprising a dielectric layer and an interconnect (e.g., formed in the dielectric layer) to route an electrical signal through the dielectric layer, where the interconnect includes a stub formed on the interconnect, and at least a portion of the stub is covered with an absorption material to at least partially absorb a portion of the electric signal that is reflected by the stub. In some embodiments, the apparatus may comprise a PCB assembly, a die, a package substrate, or a printed circuit board. More generally, the apparatus may comprise any structure pertaining to a flip chip configuration or direct chip attach (DCA) configuration.

FIG. 1 illustrates a cross-section side view of an example printed circuit board (PCB) assembly 100, in accordance with some embodiments. The PCB assembly 100 may comprise a substrate 102. The substrate 102 may be an organic substrate made of dielectric material including, for example, build-up layers (not shown) configured to route electrical signals through the PCB assembly 100. The PCB assembly may include one or more interconnects (such as interconnect 104) configured to route electrical signals 106 such as, for example, input/output (I/O) signals and/or power or ground signals associated with the operation of the PCB assembly 100. In some embodiments, the interconnect 104 may comprise a via filled with a conductive material, such as copper, to provide for electrical conductivity for the incoming signal 106.

In some embodiments, the incoming signal 106 may be routed via an electrically conductive line (e.g., transmission line 110) into the interconnect 104, to a receiving point (not shown) via another electrically conductive line 112, as shown. Accordingly, the incoming signal may be split into two portions. One portion, a desired transmission signal 118, may travel to the receiving point via the conductive line 112, while another portion may continue traveling through a stub portion 122 of the interconnect 104, forming a reflected noise signal 120. The reflected noise signal 120 may comprise surface waves and/or evanescent waves, and may include some propagating waves.

The PCB assembly 100 may further comprise a layer of an absorption material 130 that may be disposed about at least a portion of the stub 122. For example, as shown in FIG. 1, the absorption material 130 may cover at least a bottom of the stub 122 forming an end of the interconnect 104. The absorption material 130 covering a portion of the stub 122 may at least partially absorb the reflected noise signal 120 on the stub 122, thus reducing inter-symbol interference (ISI) and harmful coupling, and correcting timing jitter that may be induced by the reflected noise signal 120. The reduction of the reflected noise signal 120 using the absorption material 130 to cover the stub 122 may be particularly effective in the high speed signaling.

Besides via stubs such as the stub 122, the absorption material 130 may be used to mitigate the stub effects for other types of interconnects that may be used in high speed signaling and interconnects. Other interconnect types may include, for example, transmission lines or edge connectors ("gold finger" connectors), which are described in reference to FIGS. 2 and 3, respectively.

Figure 2:
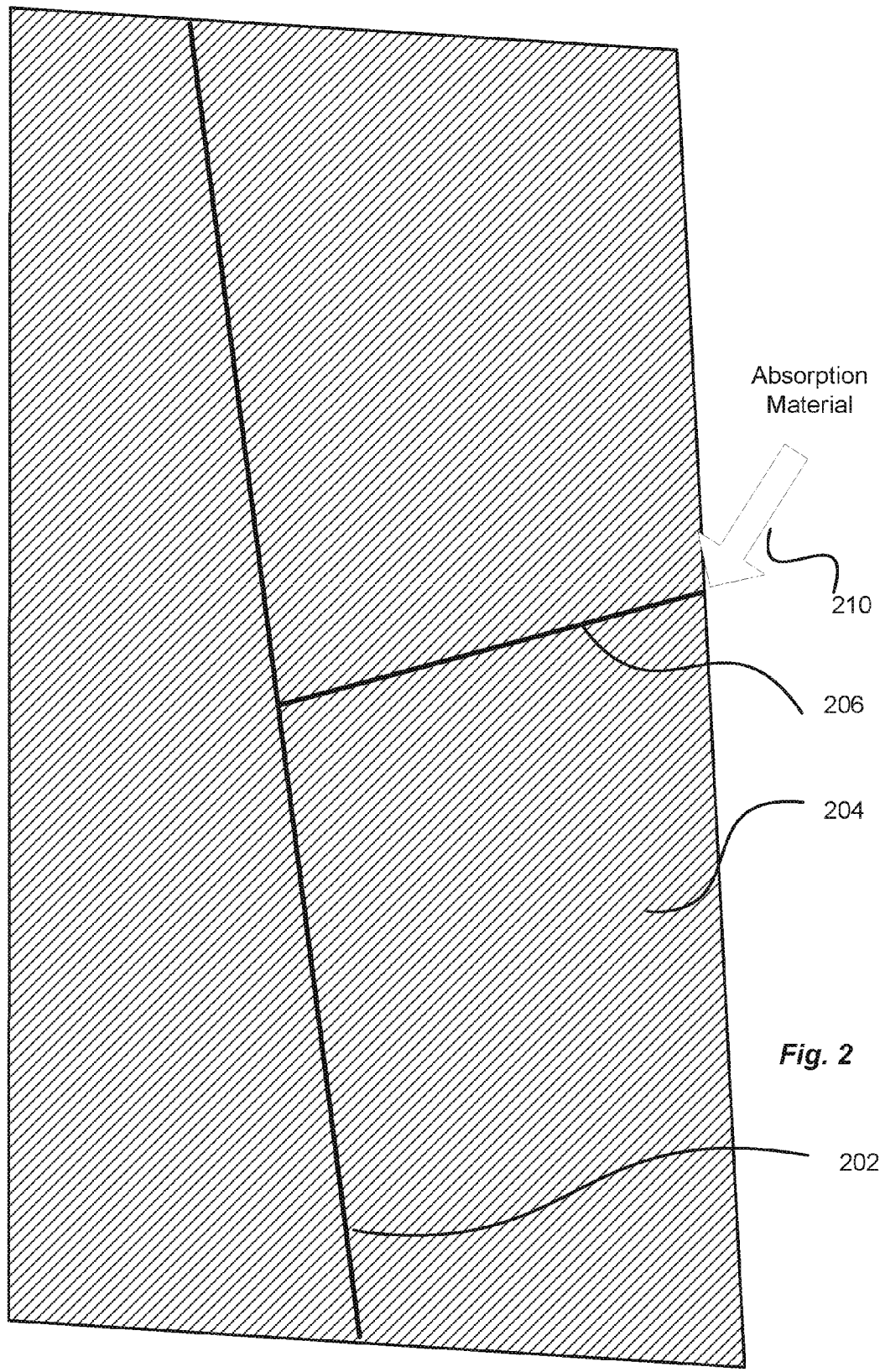
FIG. 2 schematically illustrates a transmission line placed within a substrate, with a transmission line stub to be covered with an absorption material, in accordance with some embodiments.

FIG. 2 schematically illustrates a transmission line placed within a substrate, with a transmission line stub to be covered with an absorption material, in accordance with some embodiments. As shown, a transmission line 202 may be disposed in a substrate (e.g., PCB substrate) 204. The transmission line 202 may include a stub 206 extending from the transmission line 202. The absorption material may be applied to cover or embed the stub 206 as indicated by arrow 210. For internal routing transmission line 202 (e.g., stripline), a via may be drilled to an upper layer of the PCB substrate 204 to connect with the stub 206 (not shown). For external routing (e.g., micro-stripline), the absorption material may be disposed on top of the PCB substrate 204, to partially cover the upper layer and the connection with stub 206.

Figure 3:
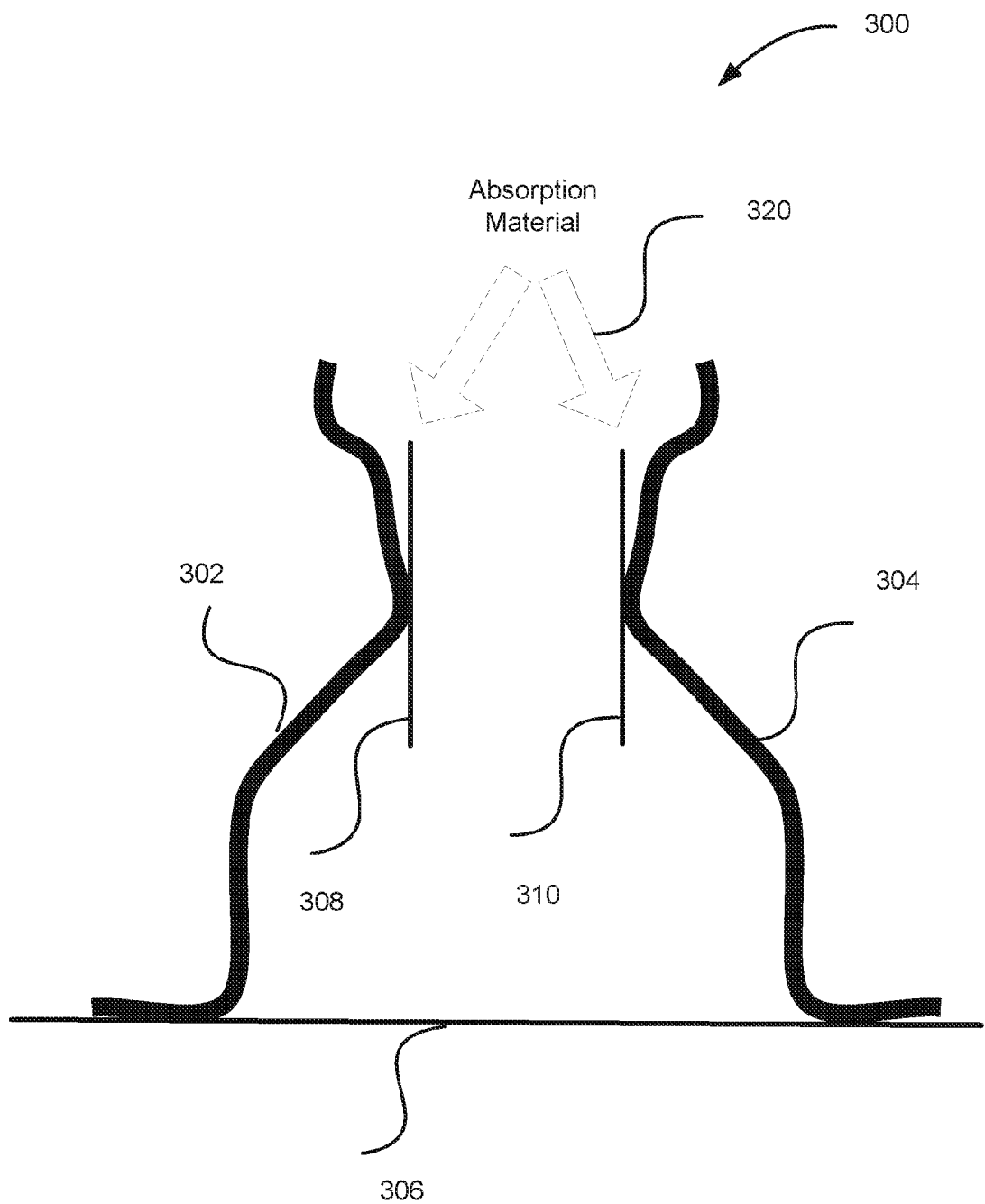
FIG. 3 schematically illustrates an edge connector placed on a substrate, with an edge connector stub to be covered with an absorption material, in accordance with some embodiments.

FIG. 3 schematically illustrates an edge connector placed on a substrate, with an edge connector stub to be covered with an absorption material, in accordance with some embodiments. As shown, an edge connector (e.g., "gold finger" connector) 300 may include a pair of "fingers" 302 and 304 and may be disposed about the edge of the PCB substrate 306. The "fingers" 302 and 304 may include one or more stubs, such as stubs 308 and 310, respectively. The absorption material may be applied to at least portions of the stubs 308 and 310 as indicated by arrows 320. For example, the absorption material may be added to the bottom of a connector in which the edge connector 300 may be plugged.

In some embodiments, the absorption material 130 may be selected so as to cause the reflected noise signal 120 comprising, e.g., electromagnetic waves entering the absorption material 130 to attenuate quickly and dissipate as heat, thus reducing or eliminating the reflected noise signal 120. The wave propagation factor for electromagnetic wave of the reflected noise signal 120 may be derived as follows.

The electromagnetic wave number in vacuum (free space) may be defined as $$k_0 = \frac{2\pi}{\lambda_0}$$

where $k_0$ and $\lambda_O$ are the electromagnetic wave number and wavelength in vacuum. The electromagnetic wave number in media k (e.g., absorption material with relative permittivity $\tilde{\in}_r$ and relative permeability $\tilde{\mu}_r$) may be written as $$k = k_0 \sqrt{\tilde{\mu}_r \tilde{\in}_r}$$

Since $\tilde{\in}_r = \in_r (1+j \tan \delta)$, where $\tan \delta$ is loss tangent of the absorption material, $\delta$ is the angle of loss tangent, $\in_r$ is relative dielectric constant of the absorption material, and non-magnetic material permeability $\tilde{\mu}_r = 1$, the electromagnetic wave number k may be defined as $$k = k_0 \sqrt{\in_r(1+j\tan\delta)},$$

where j is the imaginary unit.

The wave propagation factor may be derived from a Maxwell equation following the following sequence of expressions:

$$\exp(jkd) = \exp\left(jdk_0 \sqrt{\varepsilon_r(1+j\tan\delta)}\right)$$

or $$\exp(jkd) = \exp\left(jd\frac{2\pi}{\lambda_0} \sqrt{\varepsilon_r(1+j\tan\delta)}\right)$$

where d is the distance of wave propagation inside the absorption material and $\lambda_0$ is wavelength of free space. The above expression may be written as follows:

$$\exp(jkd) = \exp\left(jd\frac{2\pi}{\lambda_0}\left[\text{real}\left(\sqrt{\varepsilon_r(1+j\tan\delta)}\right) + j \cdot \text{imag}\left(\sqrt{\varepsilon_r(1+j\tan\delta)}\right)\right]\right)$$

or $$\exp(jkd) = \exp\left(d\frac{2\pi}{\lambda_0}\left[j\,\text{real}\left(\sqrt{\varepsilon_r(1+j\tan\delta)}\right) - \text{imag}\left(\sqrt{\varepsilon_r(1+j\tan\delta)}\right)\right]\right)$$

The final expression may be written as follows:

$$\exp(jkd) = \exp\left(jd\frac{2\pi}{\lambda_0}\text{real}\left(\sqrt{\varepsilon_r(1+j\tan\delta)}\right)\right)\exp\left(-d\frac{2\pi}{\lambda_0}\text{imag}\left(\sqrt{\varepsilon_r(1+j\tan\delta)}\right)\right)$$

with loss factor being $$\exp\left(-d\frac{2\pi}{\lambda_0}\text{imag}\left(\sqrt{\varepsilon_r(1+j\tan\delta)}\right)\right).$$

Based on electromagnetic wave theory and the above expressions, the reflected waves may be ideally (fully) absorbed, if the absorption material satisfies the following conditions:
 the loss tangent, $\tan \delta$, may be above one (>1) for a frequency range of a frequency of the reflected noise signal and, in ideal conditions, may remain constant across the frequency range;
 the dielectric constant, $\in_r$, may be inversely proportional to frequency, so that the loss factor may remain constant for the frequency range of the frequency of the reflected noise signal.

The above requirements are formulated for ideal absorption (e.g., elimination) of reflected noise signal by an absorption material. Different types of absorption materials with properties approximating or satisfying the above conditions with desired threshold margins may be used to at least partially absorb reflected noise signals in the interconnect stubs. For example, absorption materials may be used that are produced by Cuming Microwave Corporation, MAST, Western Rubber and Supply, Inc., and the like. For example, Cuming Microwave Corporation's C-RAM MT-30 absorption material may be used for the purposes of at least partial absorption of a reflected noise signal.

Figure 4:
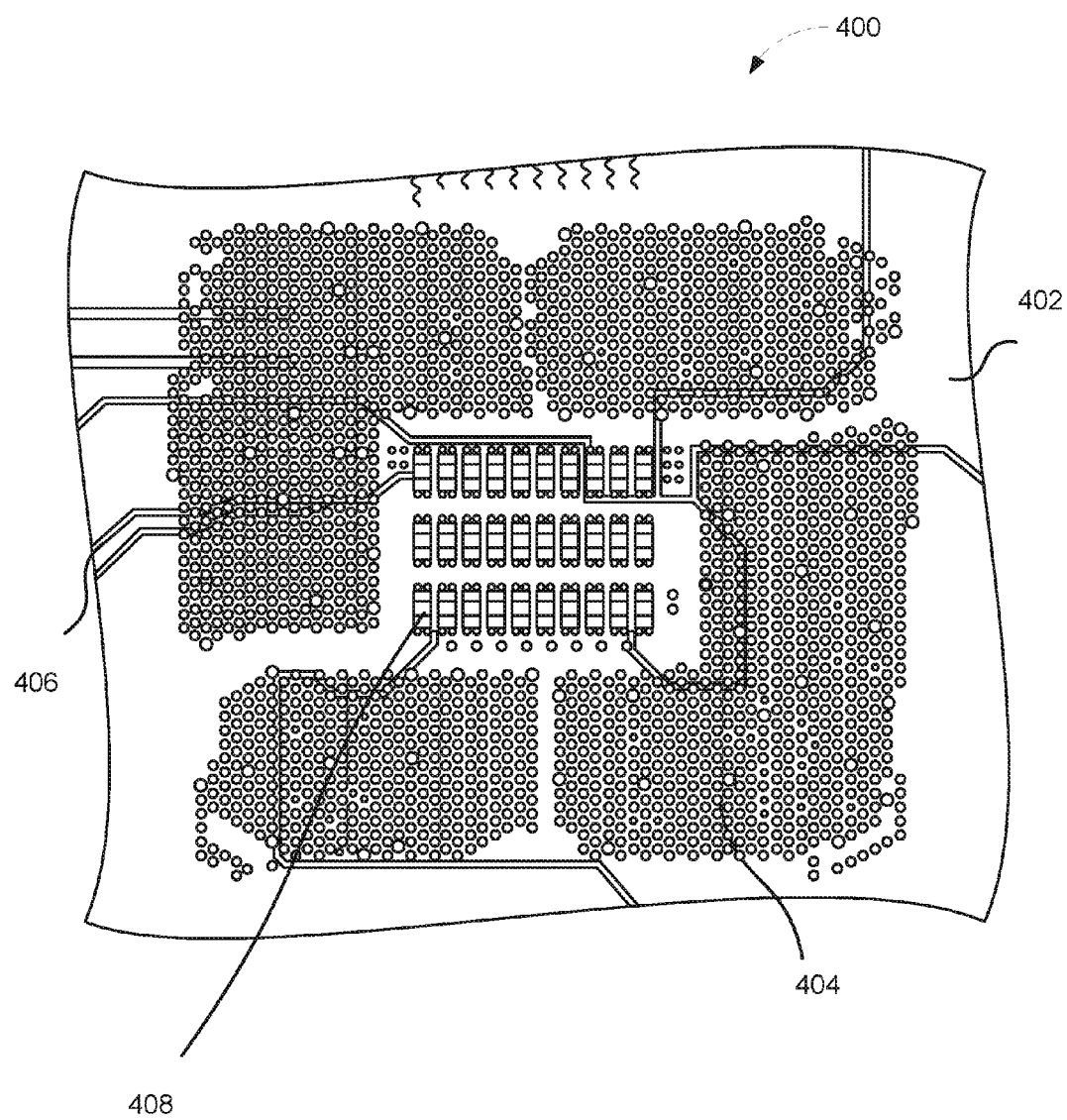
FIGS. 4-6 schematically illustrate an example PCB assembly subsequent to various fabrication operations adapted to apply an absorption material to the PCB interconnect stubs, in accordance with some embodiments.
Figure 5:
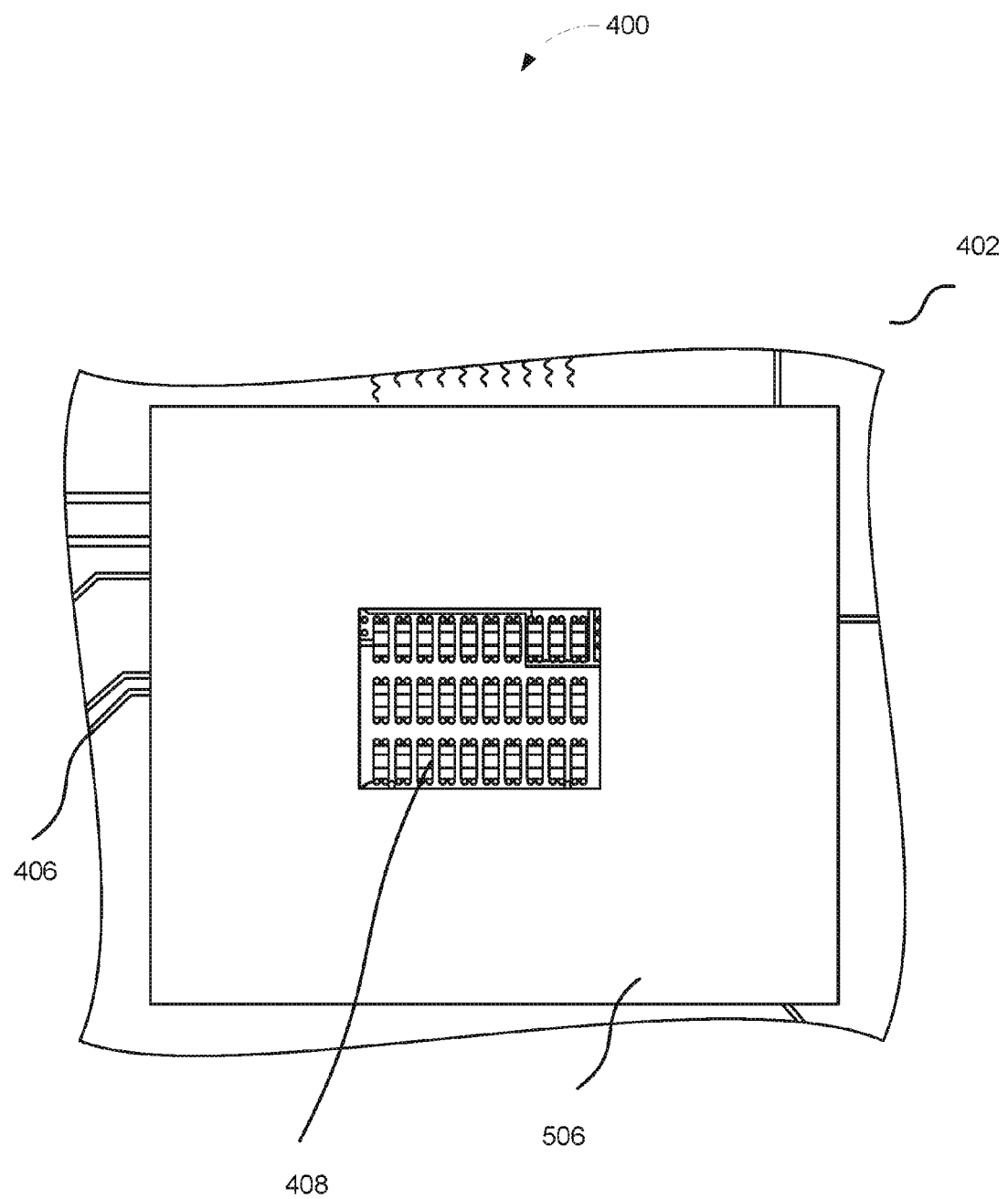
Figure 6:
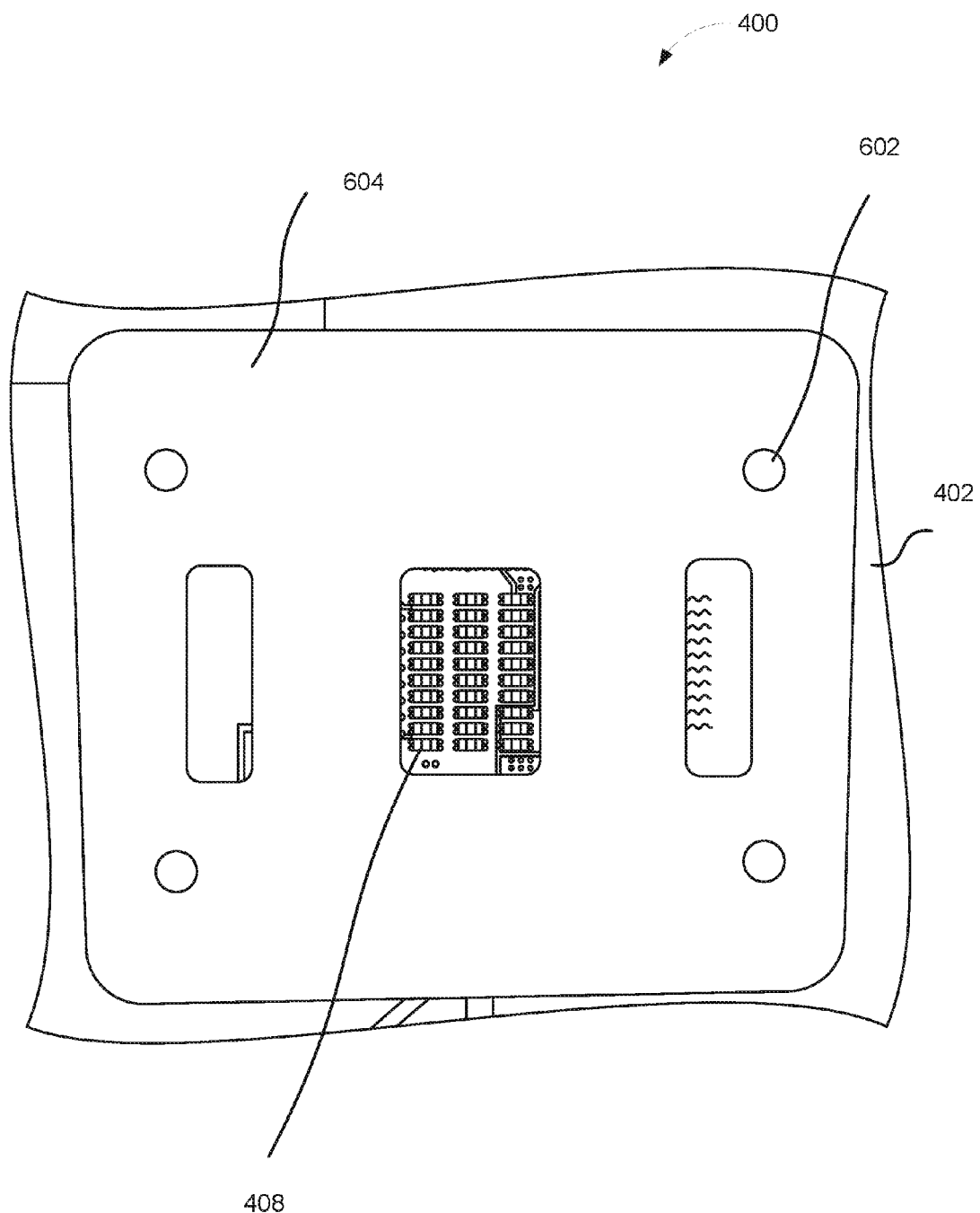

FIGS. 4-6 schematically illustrate an example PCB assembly subsequent to various fabrication operations adapted to apply an absorption material to the PCB interconnect stubs, in accordance with some embodiments. For illustration purposes, the example PCB assembly may comprise a central processing unit (CPU) socket that provides mechanical and electrical connections between a processor and a PCB in a computing apparatus.

Referring to FIG. 4, a back view of an example CPU socket 400 is shown. The CPU socket 400 may be disposed on a PCB substrate 402, a portion of which is shown in FIG. 4, with removed cover plate. The CPU socket 400 may include an array of vias such as dense via array 404. In FIGS. 4-6, the PCB assembly 400 may include a substrate 402 made of a dielectric (e.g., organic) material, similar to the substrate 102 discussed above. The PCB assembly may also include other components, such as conductive lines 406 or decoupling capacitors 408.

Referring to FIG. 5, the CPU socket 400 is depicted subsequent to adding a piece of absorption material 506 to cover the via array 404 under the CPU socket 400. The absorption material may be disposed on the via array 404 by means of gluing or fastening, for example.

In another example, the absorption material may be retained on the via array 404 by using pressure provided by a socket retention mechanism. Referring to FIG. 6, retention elements 602 (e.g., screws, bolts, or other equivalent components) may be provided through the substrate 402, to connect the socket retention mechanism (not shown) with a cover plate 604. Referring to FIG. 6, the CPU socket 400 is depicted subsequent to placing the cover plate 604 onto the CPU socket 400, with the cover plate 604 kept in place by the retention elements 602.

The cover plate 602 connected through the substrate 402 with the socket retention mechanism may apply pressure to the absorption material covered by the cover plate 604, retaining the material in place to substantially cover the via array 404. The cover plate may compress the absorption material, which may include a foam-like material, reducing the cell size of the absorption material.

Figure 7:
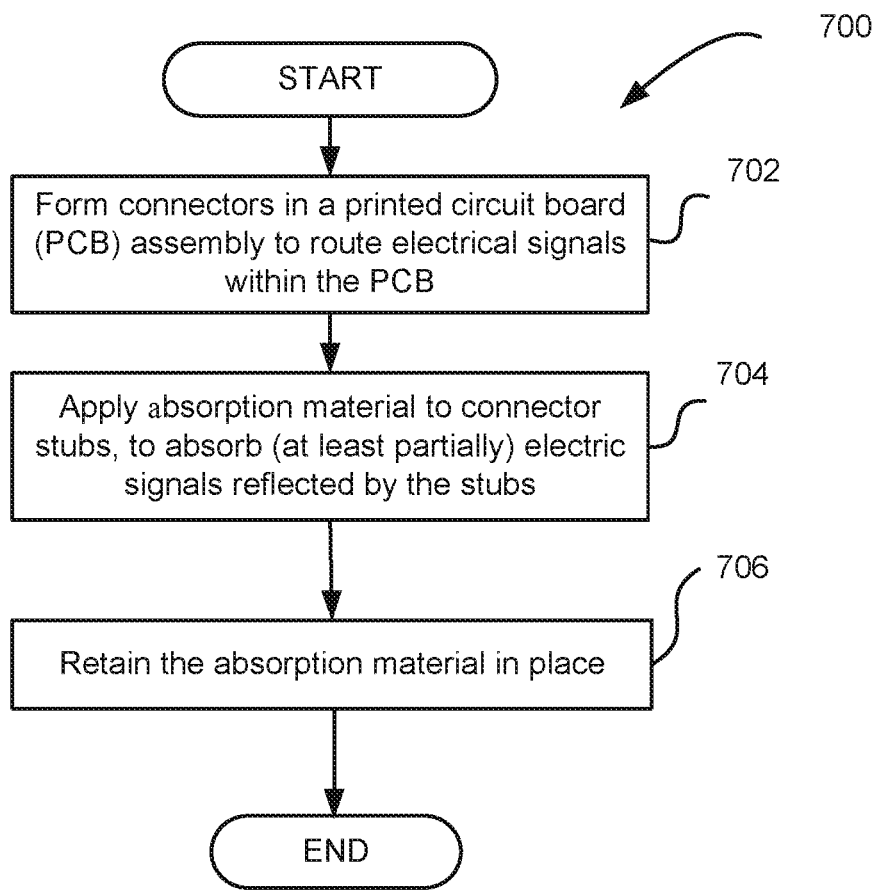
FIG. 7 is a process flow diagram for providing an absorption material to interconnect stubs of interconnects in an apparatus, such as a PCB assembly, in accordance with some embodiments.

FIG. 7 is a process flow diagram for providing an absorption material to stubs of interconnects in an apparatus, such as a PCB assembly, in accordance with some embodiments. The process 700 may comport with actions described in connection with FIGS. 1-6 in some embodiments.

At block 702, one or more interconnects may be formed in a printed circuit board (PCB) assembly to route electrical signals within the PCB. In some embodiments, the interconnects may comprise vias or other types of interconnects, described in reference to FIGS. 1-3. In some embodiments, the interconnects may comprise a via array such as via array 404 described in reference to FIGS. 4-6. Forming interconnects may include disposing electrically conductive material inside the interconnects (e.g., vias) to enable routing of the electrical signals. At least some of the interconnects may include stubs formed on the interconnects as described in reference to FIGS. 1-3.

At block 704, an absorption material may be applied to at least portions of the interconnect stubs, to absorb (at least partially) portions of the electric signals reflected by the stubs, e.g., the reflected noise signals described in reference to FIG. 1. The absorption material may be applied in a number of different ways described in reference to FIGS. 2-6. For example, the interconnects may be dense vias having stub ends that are exposed on a surface of the PCB. Applying an absorption material may include covering stub ends with the absorption material as described in reference to FIGS. 4-6.

In some embodiments, prior to applying the absorption material to the interconnect stubs, the absorbing material may be selected according to the criteria described above. For example, the absorbing material may be selected such that a dielectric loss tangent of the absorbing material may be greater than one, for a frequency range of a frequency of the reflected portions of the electric signals. The absorbing material may be further selected such that a relative dielectric constant of the absorbing material may be inversely proportionate to the frequency of the reflected portions of the electric signals.

At block 706, the absorbing material may be retained in place by fastening, gluing, applying pressure, or other methods described above.

Figure 8:
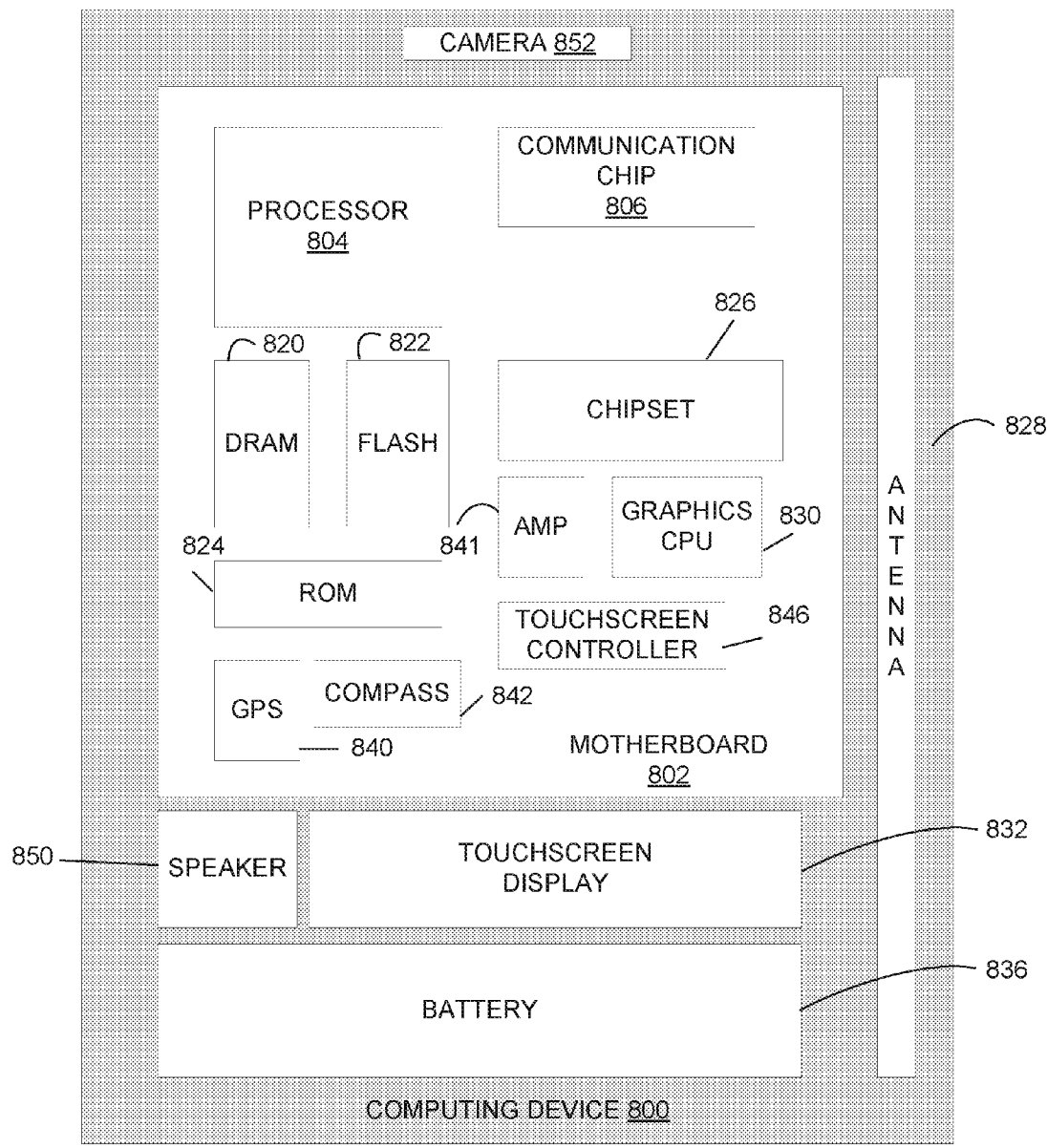
FIG. 8 schematically illustrates a computing device including a PCB assembly in accordance with some embodiments.

FIG. 8 schematically illustrates a computing device 800 including at least a PCB assembly in accordance with some embodiments. The computing device 800 may house a board such as motherboard 802. The motherboard 802 may be implemented as the PCB assembly 100 described in reference to FIG. 1. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., dynamic random-access memory (DRAM)) 820, non-volatile memory (e.g., read-only memory (ROM)) 824, flash memory 822, a graphics processor 830, a digital signal processor or a crypto processor (not shown), a chipset 826, an antenna 828, a display (e.g., touchscreen display) 832, a touchscreen controller 846, a battery 836, a power amplifier 841, a global positioning system (GPS) device 840, a compass 842, a speaker 850, a camera 852, a mass storage device (such as hard disk drive, compact disk (CD), or digital versatile disk (DVD)), an audio codec, a video codec, a Geiger counter, an accelerometer, a gyroscope (not shown), and so forth.

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth, and a second communication chip 806 may be dedicated to longer range wireless communications such as GPS, EDGE, GPRS, CDMA, WiMAX, LTE, EV-DO, and others.

The processor 804 of the computing device 800 may include a die or a package substrate as described herein. For example, a package substrate (e.g., substrate 402 of FIG. 2) having the die mounted thereon may be coupled with a circuit board such as, for example, motherboard 802, using package-level interconnects such as, for example, ball-grid array (BGA) or land-grid array (LGA) structures. The term "processor" may refer to any device or portion of a device that processes electronic data from registers and/or memory to transform that electronic data into other electronic data that may be stored in registers and/or memory.

The communication chip 806 may also include a die or a package substrate as described herein. In further implementations, another component (e.g., memory device or other integrated circuit device) housed within the computing device 800 may contain a die or package substrate as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

According to various embodiments, the present disclosure describes a number of examples. Example 1 is a printed circuit board (PCB) assembly for absorbing reflected electric signal, comprising: a substrate and at least one interconnect formed in the substrate to route an electrical signal within the PCB, wherein the interconnect includes a stub formed on the interconnect, wherein at least a portion of the stub is covered with an absorbing material to at least partially absorb a portion of the electric signal that is reflected by the stub.

Example 2 may include the subject matter of Example 1, and further specifies that the interconnect comprises a via that extends through the substrate, wherein the stub is formed by at least a portion of the via, a bottom of the stub that forms an end of the via.

Example 3 may include the subject matter of Example 2, and further specifies that the portion of the stub covered with the absorbing material includes at least the bottom the stub.

Example 4 may include the subject matter of Example 1, and further specifies that the interconnect comprises a gold finger connector.

Example 5 may include the subject matter of Example 1, and further specifies that the interconnect comprises a transmission line that extends through the substrate.

Example 6 may include the subject matter of Example 1, and further specifies that the electrical signal comprises a transmission signal transmitted with a speed above a threshold.

Example 7 may include the subject matter of Example 1, and further specifies that a dielectric loss tangent of the absorbing material is greater than one, for a frequency range of a frequency of the reflected portion of the electric signal that is to be at least partially absorbed.

Example 8 may include the subject matter of Example 7, and further specifies that a relative dielectric constant of the absorbing material is inversely proportionate to the frequency of the reflected portion of the electric signal that is to be at least partially absorbed.

Example 9 may include the subject matter of Example 8, and further specifies that the dielectric loss tangent of the absorbing material is substantially constant for the frequency range of the frequency of the reflected portion of the electric signal that is to be at least partially absorbed.

Example 10 may include the subject matter of Example 1, and further specifies that the absorbing material comprises Cuming Microwave Corporation® C-RAM MT-30.

Example 11 may include the subject matter of Examples 1-10, and further specifies that the at least one interconnect comprises a central processing unit (CPU) socket.

Example 12 may include an apparatus for absorbing reflected electric signal, comprising: at least one dielectric layer; and an interconnect formed in the at least one dielectric layer to route an electrical signal through the dielectric layer, wherein the interconnect includes a stub formed on the interconnect, wherein at least a portion of the stub is covered with an absorbing material to at least partially absorb a portion of the electric signal that is reflected by the stub.

Example 13 may include the subject matter of Example 12, and further specifies that the apparatus comprises a die that includes the at least one dielectric layer and the interconnect.

Example 14 may include the subject matter of Example 12, and further specifies that the apparatus comprises a package substrate that includes the at least one dielectric layer and the interconnect.

Example 15 may include the subject matter of Example 12, and further specifies that the apparatus comprises a printed circuit board that includes the at least one dielectric layer and the interconnect.

Example 16 may include the subject matter of Example 12, and further specifies that the interconnect comprises one of: a via that extends through the dielectric layer and has an electrically conductive material disposed within the via to provide electrical connectivity for routing the electrical signal, or a transmission line that extends through the dielectric layer.

Example 17 may include the subject matter of Example 12, and further specifies that the absorbing material has a dielectric loss tangent that is greater than one, for a frequency range of a frequency of the reflected portion of the electric signal that is to be at least partially absorbed.

Example 18 may include the subject matter of Examples 12-17, and further specifies that the absorbing material has a relative dielectric constant that is inversely proportionate to the frequency of the reflected portion of the electric signal that is to be at least partially absorbed.

Example 19 may include a method for absorbing reflected electric signal, comprising: forming one or more interconnects in a printed circuit board (PCB) assembly to route electrical signals within the PCB, at least some of the interconnects having stubs formed on the interconnects; and applying an absorbing material to at least portions of the stubs, to at least partially absorb portions of the electric signals reflected by the stubs.

Example 20 may include the subject matter of Example 19, and further specifies that the one or more interconnects comprise vias, wherein forming one or more interconnects includes disposing electrically conductive material inside the vias to enable routing of the electrical signals.

Example 21 may include the subject matter of Example 20, and further specifies that the vias comprise dense vias having stub ends that are exposed on a surface of the PCB, wherein applying the absorbing material includes covering the stub ends with the absorbing material.

Example 22 may include the subject matter of Example 21, and further specifies that the vias comprise a via array.

Example 23 may include the subject matter of Example 22, and further specifies that the PCB comprises a central processing unit (CPU) socket.

Example 24 may include the subject matter of Example 23, and further specifies that the method further includes covering the CPU socket with a cover plate to retain the absorbing material in place to cover the via array.

Example 25 may include the subject matter of Examples 19 to 24, and further specifies that the method further includes selecting the absorbing material such that a dielectric loss tangent of the absorbing material is greater than one, for a frequency range of a frequency of the reflected portions of the electric signals, and a relative dielectric constant of the absorbing material is inversely proportionate to the frequency of the reflected portions of the electric signals.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A printed circuit board (PCB) assembly comprising:
    a substrate; and
    at least one interconnect formed in the substrate to route an electrical signal, wherein the interconnect includes a pair of electrically conductive lines disposed about an edge of the substrate, wherein each electrically conductive line includes a stub coupled with the line, wherein the stub forms an electric path that extends away from the electrically conductive line, wherein the electrical signal includes a desired transmission signal portion to travel via the electrically conductive line and a stub signal portion to travel through the stub, to form a reflected noise signal in response to a reflection by an end of the stub,
    wherein at least a portion of the end of the stub is covered with an absorbing material to at least partially absorb the portion of the electrical signal that is reflected by the end of the stub, wherein the absorbing material has a dielectric loss tangent that remains substantially constant, for a frequency range of a frequency of the reflected portion of the electrical signal that is to be at least partially absorbed.

2. The PCB assembly of claim 1, wherein the interconnect further comprises a via that extends through the substrate.

3. The PCB assembly of claim 2, wherein a portion of the stub covered with the absorbing material includes at least an end of the stub.

4. The PCB assembly of claim 1, wherein the interconnect comprises a gold finger connector.

5. The PCB assembly of claim 1, wherein a determined value of the dielectric loss tangent of the absorbing material is greater than 1, for a frequency range of a frequency of the reflected portion of the electrical signal that is to be at least partially absorbed.

6. The PCB assembly of claim 5, wherein a relative dielectric constant of the absorbing material is inversely proportionate to the frequency of the reflected portion of the electrical signal that is to be at least partially absorbed.

7. The PCB assembly of claim 6, wherein the dielectric loss tangent of the absorbing material is substantially constant for the frequency range of the frequency of the reflected portion of the electrical signal that is to be at least partially absorbed.

8. The PCB assembly of claim 1, wherein the absorbing material comprises Cuming Microwave Corporation® C-RAM MT-30.

9. The PCB assembly of claim 1, wherein the at least one interconnect comprises a central processing unit (CPU) socket.

10. A method, comprising:
    forming an interconnect in a printed circuit board (PCB) assembly to route an electrical signal, the interconnect having a pair of electrically conductive lines disposed about an edge of a substrate, wherein each electrically conductive line includes a stub coupled with the line, wherein a stub forms an electric path that extends away from the electrically conductive line, wherein the electrical signal includes a desired transmission signal portion to travel via the electrically conductive line and a stub signal portion to travel through the stub, to form a reflected noise signal in response to a reflection by an end of the stub; and
    applying an absorbing material to at least a portion of the stubs, to at least partially absorb portions of the electrical signals reflected by the end of the stub, wherein the absorbing material has a dielectric loss tangent that remains substantially constant, for a frequency range of a frequency of the reflected portion of the electrical signal that is to be at least partially absorbed.

11. The method of claim 10, wherein the interconnect further comprises a via, wherein forming the interconnect includes disposing electrically conductive material inside the via to enable routing of the electrical signals.

12. The method of claim 10, wherein applying the absorbing material includes covering at least an end of the stub with the absorbing material.

13. The method of claim 10, wherein the PCB comprises a central processing unit (CPU) socket.

14. The method of claim 10, further comprising:
    selecting the absorbing material such that a dielectric loss tangent of the absorbing material is substantially constant, for a frequency range of a frequency of the reflected portions of the electrical signals, and a relative dielectric constant of the absorbing material is inversely proportionate to the frequency of the reflected portions of the electrical signals.

* * * * *